United States Patent
Chun

(10) Patent No.: US 6,566,241 B2
(45) Date of Patent: May 20, 2003

(54) METHOD OF FORMING METAL CONTACT IN SEMICONDUCTOR DEVICE

(75) Inventor: Yoon-soo Chun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/994,127

(22) Filed: Nov. 26, 2001

(65) Prior Publication Data

US 2002/0146899 A1 Oct. 10, 2002

(30) Foreign Application Priority Data

Apr. 9, 2001 (KR) ........................ 2001-18641

(51) Int. Cl.⁷ .......................................... H01L 21/4763
(52) U.S. Cl. .................. 438/618; 438/142; 438/197; 438/296; 438/421; 438/426; 438/637; 438/639; 438/640; 438/672; 438/675; 438/689; 438/618; 438/733; 438/740; 438/751
(58) Field of Search .................. 438/296, 142, 438/197, 733, 751, 740, 689, 421, 637, 639, 640, 672, 675, 426, 618

(56) References Cited

U.S. PATENT DOCUMENTS

| | | | | |
|---|---|---|---|---|
| 4,833,519 A | * | 5/1989 | Kawano et al. | 257/752 |
| 5,776,833 A | * | 7/1998 | Chen et al. | 438/672 |
| 5,789,360 A | * | 8/1998 | Song et al. | 134/3 |
| 5,872,053 A | * | 2/1999 | Smith | 438/626 |
| 5,990,020 A | * | 11/1999 | Ha | 438/738 |
| 6,022,776 A | * | 2/2000 | Lien et al. | 257/296 |
| 6,057,188 A | * | 5/2000 | El-Kareh et al. | 438/243 |
| 6,211,071 B1 | * | 4/2001 | Lukanc et al. | 438/624 |
| 6,242,809 B1 | * | 6/2001 | Lee | 257/764 |
| 6,350,649 B1 | * | 2/2002 | Jeong et al. | 438/253 |
| 2001/0007365 A1 | * | 7/2001 | Lee | 257/296 |
| 2001/0046737 A1 | * | 11/2001 | Ahn et al. | 438/253 |
| 2002/0072223 A1 | * | 6/2002 | Gilbert et al. | 438/629 |
| 2002/0125549 A1 | * | 9/2002 | Cohen et al. | 257/642 |

* cited by examiner

*Primary Examiner*—Amir Zarabian
*Assistant Examiner*—Ida M. Soward
(74) *Attorney, Agent, or Firm*—Mills & Onello LLP

(57) ABSTRACT

A method of forming metal contacts in a semiconductor device having an active metal contact region and a bit line contact region is provided. In the method, a contact pad is formed in the active metal contact region and the bit line contact region using a conductive plug. An etch stopper is formed on the upper sides of the conductive plug. A portion of a lower interlayer dielectric layer is etched so that the etch stopper protrudes above the lower interlayer dielectric layer. A bit line stack is formed in the bit line contact region. An etch stopper is formed in the active metal contact region. An upper interlayer dielectric layer is etched to expose the surfaces of the etch stopper and bit line capping layer pattern of the bit line stack. The exposed surfaces of the etch stopper and bit line capping layer pattern are etched to form a contact hole which exposes the conductive plug and a bit line conductive layer of the bit line stack. The contact hole is filled with a conductive layer.

17 Claims, 6 Drawing Sheets

METHOD OF FORMING METAL CONTACT IN SEMICONDUCTOR DEVICE

BACKGROUND OF THE INVENTION

1. Field of the Invention

The present invention relates to a method of forming a semiconductor device, and more particularly, to a method of forming a metal contact in a semiconductor device using a metal contact pad.

2. Description of the Related Art

In order to increase the integration and cell capacitance of semiconductor devices, such as direct random access memories (DRAMs) where capacitors are formed on transistors, the height of the capacitors has been increased. An interlayer dielectric layer is etched to form contact holes which expose the surface of a lower layer to be contacted with a metal interconnection, thereby forming metal interconnection lines. However, as the interlayer dielectric layer becomes thick, it is unevenly etched. As a result, the surface of the lower layer may not be exposed.

Accordingly, to solve this problem, a technique for forming a metal contact using a metal contact pad is used. According to this technique, a conductive plug is formed. The conductive plug perforates a lower interlayer dielectric layer and short-circuits a lower layer, thereby forming a contact pad. An etch stopper is formed on the conductive plug. A contact hole which perforates an upper interlayer dielectric layer is formed to expose the etch stopper. The exposed etch stopper is etched to form a contact hole which exposes the conductive plug. In this technique, an etch stopper is formed to decrease the depth of an interlayer dielectric layer to be etched by the thickness of a metal contact pad. Thus, uneven etching is prevented and the surface of the lower layer is exposed.

However, in general, a plurality of metal contacts in a semiconductor device are simultaneously formed. For example, an active metal contact directly connected to an active region and a bit line metal contact directly connected to a bit line conductive layer are simultaneously formed. In this case, an upper interlayer dielectric layer is etched to form a contact hole which exposes an etch stopper and a bit line capping layer. The etch stopper in the active metal contact region and the bit line capping layer in the bit line contact region are simultaneously etched. However, in general, the bit line capping layer is thicker than the etch stopper. Thus, when the etch stopper has already been completely etched in the active metal contact region, the bit line capping layer is still being etched. As a result, a lower interlayer dielectric layer may be overetched, thereby short-circuiting a metal contact and a gate conductive layer. In this case, a semiconductor device may not perform properly.

SUMMARY OF THE INVENTION

To solve the above problems, it is an object of the present invention to provide a method of forming a metal contact in a semiconductor device by which misalignment and overetching can be better prevented.

According to the present invention, there is provided a method of forming a metal contact in a semiconductor device having an active metal contact region and a bit line contact region. In the method, gate stacks are formed on a semiconductor substrate. Gate spacers are formed on the sidewalls of the gate stacks. A lower interlayer dielectric layer is formed to cover the gate stacks and the gate spacers. First contact holes, which perforate the lower interlayer dielectric layer and expose an active region of the semiconductor substrate, are formed. The first contact holes are filled with a metal barrier layer and a conductive plug. An upper portion of the metal barrier layer is removed to form grooves around the upper sides of the conductive plug. The grooves are filled with an etch stopper. The lower interlayer dielectric layer is etched so that the etch stopper protrudes above the lower interlayer dielectric layer. A bit line stack is formed by sequentially stacking a bit line conductive layer and a bit line capping layer on the conductive plug in the bit line contact region. An etch stopper is formed on the conductive plug in the active metal contact region and bit line spacers at the sidewalls of the bit line stack in the bit line contact region. An upper interlayer dielectric layer is formed to cover the etch stopper, the bit line stack, and the bit line spacers. A portion of the upper interlayer dielectric layer is etched to form second contact holes which expose the etch stopper and the surface of the bit line capping layer. The etch stopper and the exposed portion of the bit line capping layer pattern are removed to form third contact holes which expose the conductive plug in the active metal contact region and the bit line conductive layer in the bit line contact region. The third contact holes are filled with a conductive layer.

In one embodiment, the gate stacks are formed by sequentially stacking gate dielectric layer patterns, gate conductive layer patterns, metal silicide layer patterns, and gate capping layer patterns.

In one embodiment, the lower interlayer dielectric layer has a thickness of 1500–1700 Å above the upper surface of the gate stacks.

In one embodiment, the grooves around the upper sides of the conductive plug have a depth of 500–700 Å and a width of 30–40 nm.

The etch stopper filling the grooves can be formed of a material having an excellent, i.e., high, etching selectivity to the lower interlayer dielectric layer. The lower interlayer dielectric layer may be a silicon oxide layer, and the etch stopper may be a silicon nitride layer.

To form the etch stopper and the bit line spacers, an etch stopper is formed on the lower interlayer dielectric layer to cover the etch stopper and the conductive plug in the active metal contact region and cover the etch stopper and the bit line stack in the bit line contact region. Next, a mask layer pattern is formed to cover the etch stopper in the active metal contact region. The etch stopper is etched by an anisotropic method using the mask layer pattern as an etching mask. The mask layer pattern is removed.

In one embodiment, the etch stopper in the active metal contact region protrudes above the lower interlayer dielectric layer.

The etch stopper can be formed of a material having an excellent, i.e., high, etching selectivity to the upper interlayer dielectric layer. The upper interlayer dielectric layer may be a silicon oxide layer, and the etch stopper may be a silicon nitride layer pattern.

The etch stopper can have a thickness of 300–600 Å, and the bit line capping layer pattern can have a thickness of 1000–2000 Å.

According to another embodiment of the present invention, there is a provided a method of forming metal contacts in a semiconductor device having an active metal contact region and a bit line contact region. In the method, gate stacks are formed on a semiconductor substrate. Gate spacers are formed on the sidewalls of the gate stacks. A lower interlayer dielectric layer is formed to cover the gate stacks and the gate spacers. First contact holes, which perforate the lower interlayer dielectric layer and expose an active region of the semiconductor substrate, are formed. The first contact holes are filled with a metal barrier layer and a conductive plug. An upper portion of the metal barrier layer is removed to expose the upper side of the conductive plug. The lower interlayer dielectric layer is etched so that the exposed upper portion of the conductive plug protrudes above the lower interlayer dielectric layer. A bit line stack is formed by sequentially stacking a bit line conductive layer pattern and a bit line capping layer pattern on the conductive plug in the bit line contact region. An etch stopper is formed on the conductive plug in the active metal contact region and bit line spacers are formed on the sidewalls of the bit line stack in the bit line contact region. An upper interlayer dielectric layer is formed to cover the etch stopper, the bit line stack, and the bit line spacers. A portion of the upper interlayer dielectric layer is etched to form second contact holes which expose the etch stopper and the bit line capping layer. The etch stopper and the exposed portion of the bit line capping layer pattern are removed to form third contact holes which expose the conductive plug in the active metal contact region and the bit line conductive layer in the bit line contact region. The third contact holes are filled with a conductive layer.

In one embodiment, to form the etch stopper and the bit line spacers, an etch stopper is formed on the lower interlayer dielectric layer to cover the conductive plug in the active metal contact region and the bit line stack in the bit line contact region. A mask layer pattern is formed to cover the etch stopper in the active metal contact region. The etch stopper is etched by an anisotropic method using the mask layer pattern as an etching mask. The mask layer pattern is removed.

The etch stopper in the active metal contact region can protrude above the lower interlayer dielectric layer.

The etch stopper can be formed of a material having an excellent, i.e., high, etching selectivity to the upper interlayer dielectric layer. The upper interlayer dielectric layer may be a silicon oxide layer, and the etch stopper may be a silicon nitride layer.

The etch stopper can have a thickness of 300–600 Å, and the bit line capping layer pattern can have a thickness of 1000–2000 Å.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Figure 1:
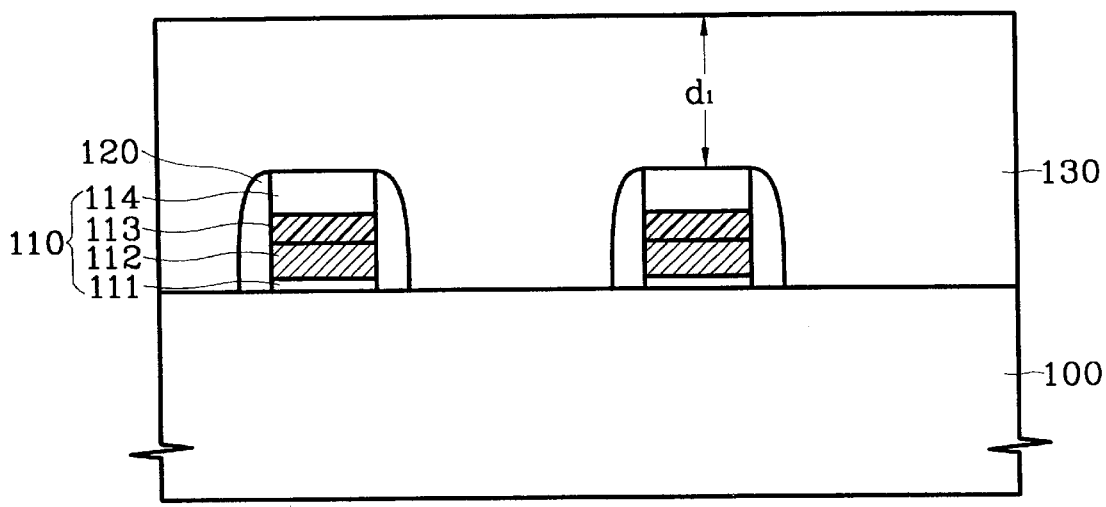
FIGS. 1 through 7 are cross-sectional views showing a method of forming a metal contact in a semiconductor device according to an embodiment of the present invention.

Hereinafter, preferred embodiments of the present invention will be described in detail with reference to the attached drawings. In the drawings, the thicknesses of layers or regions are exaggerated for clarity. Also, when it is stated that a layer is formed "on" another layer or a substrate, the layer can be formed directly on the other layer or the substrate, or other layers can intervene therebetween.

FIGS. 1 through 7 show a method of forming metal contacts in a semiconductor device according to a first embodiment of the present invention. Referring to FIG. 1, gate stacks 110 are formed on a semiconductor substrate 100. Gate spacers 120 are formed on the sidewalls of the gate stacks 110. It is not shown in the drawings but isolation regions define active regions in the semiconductor substrate 100. The isolation regions are formed by a trench isolation method but are not limited thereto. Impurity regions used as source or drain regions are formed in the active regions. The gate stacks 110 are formed by sequentially stacking gate insulating layer patterns 111, gate conductive layer patterns 112, metal silicide layer patterns 113, and gate capping layer patterns 114. The gate spacers 120 and the gate capping layer patterns 114 are formed of silicon nitride. The gate conductive layer patterns 112 are formed of polysilicon, and the metal silicide layer patterns 113 are formed of tungsten silicide. After the formation of the gate spacers 120, a lower interlayer dielectric layer 130 is formed to completely cover the semiconductor substrate 100, the surfaces of the gate capping layer patterns 114 of the gate stacks 110, and the gate spacers 120. The distance ($d_1$) from the surfaces of the gate capping layer patterns 114 to the top of the lower interlayer dielectric layer 130 is preferably about 1500–1700 Å.

Figure 2:
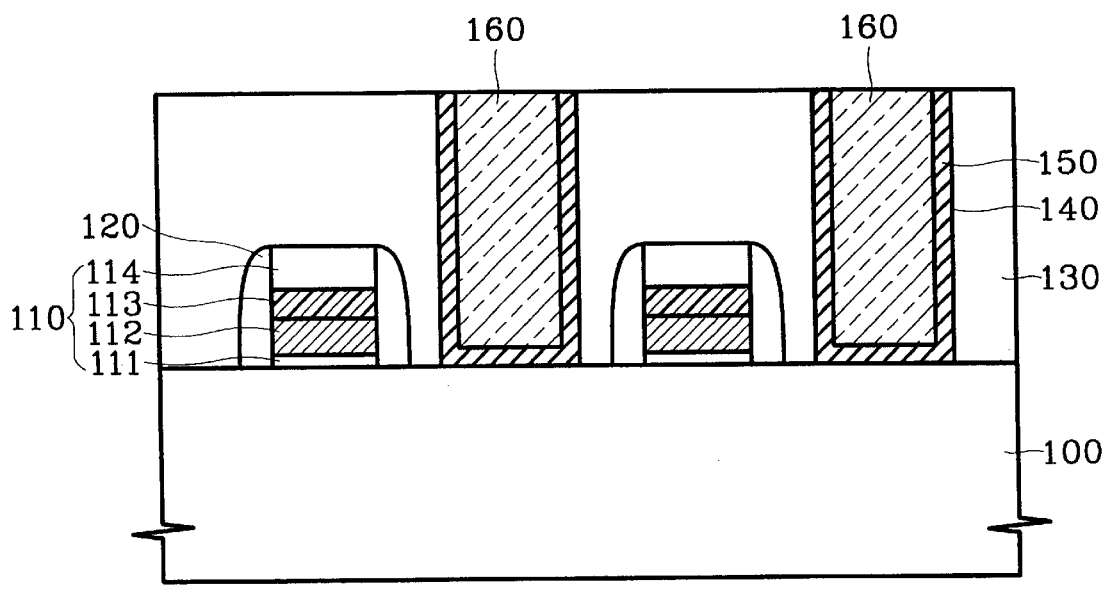

Referring to FIG. 2, contact holes 140, which perforate the lower interlayer dielectric layer 130, are formed. A metal barrier layer 150 and a conductive plug 160 are formed in each of the contact holes 140. Here, a photoresist layer pattern (not shown) is formed on the lower interlayer dielectric layer 130 by photo exposure and development processes using a common lithography method. The photoresist layer pattern has an opening to expose portions of the lower interlayer dielectric layer 130. The exposed portions of the lower interlayer dielectric layer 130 are etched using the photoresist layer pattern as an etching mask to form contact holes 140 which expose active regions of the semiconductor substrate 100. The photoresist layer pattern is removed. A metal barrier layer 150 is formed in each of the contact holes 140, and a metal layer is formed to completely fill the contact holes 140. The metal barrier layer 150 is formed of Ti/TiN, and the metal layer is formed of tungsten. The metal layer on the lower interlayer dielectric layer 130 is removed by planarizing or etching back to form a conductive plug 160 in each of the contact holes 140. The conductive plug 160 serves as a contact pad which is electrically connected to an active region of the semiconductor substrate 100 via the metal barrier layer 150.

Figure 3:
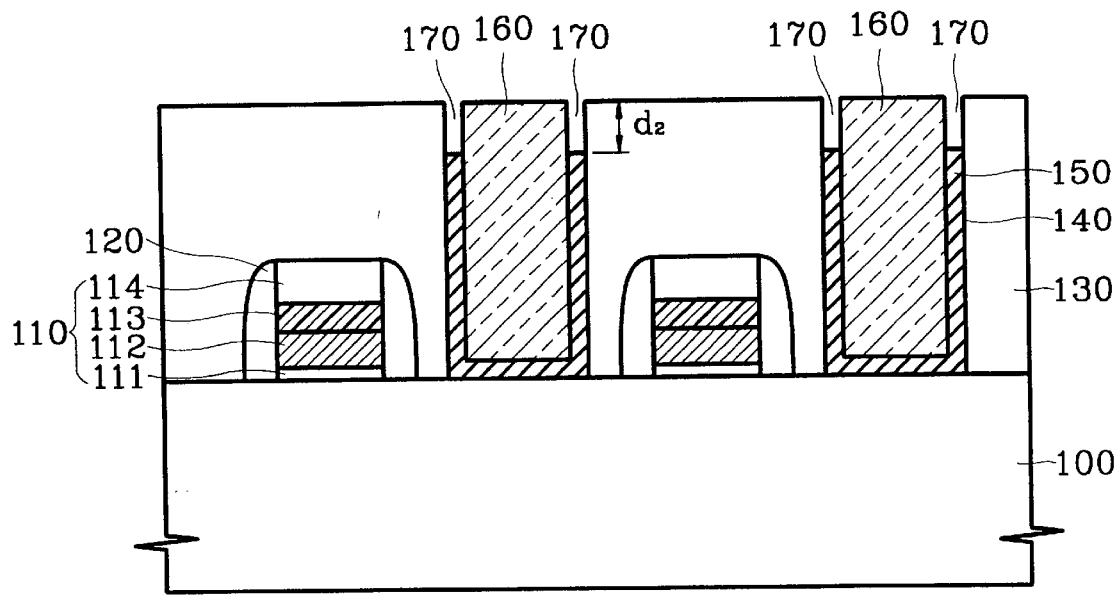

Referring to FIG. 3, the metal barrier layer 150 is removed in each of the contact holes 140 by a predetermined amount to form grooves 170 around each conductive plug 160. Portions of each metal barrier layer 150 are etched under a condition that the lower interlayer dielectric layer 130 and the conductive plug 160 have an excellent, i.e., high, etching selectivity to the metal barrier layer 150. The depth ($d_2$) and width of the grooves 170 are about 500–700 Å and 30–40 nm, respectively.

Figure 4:
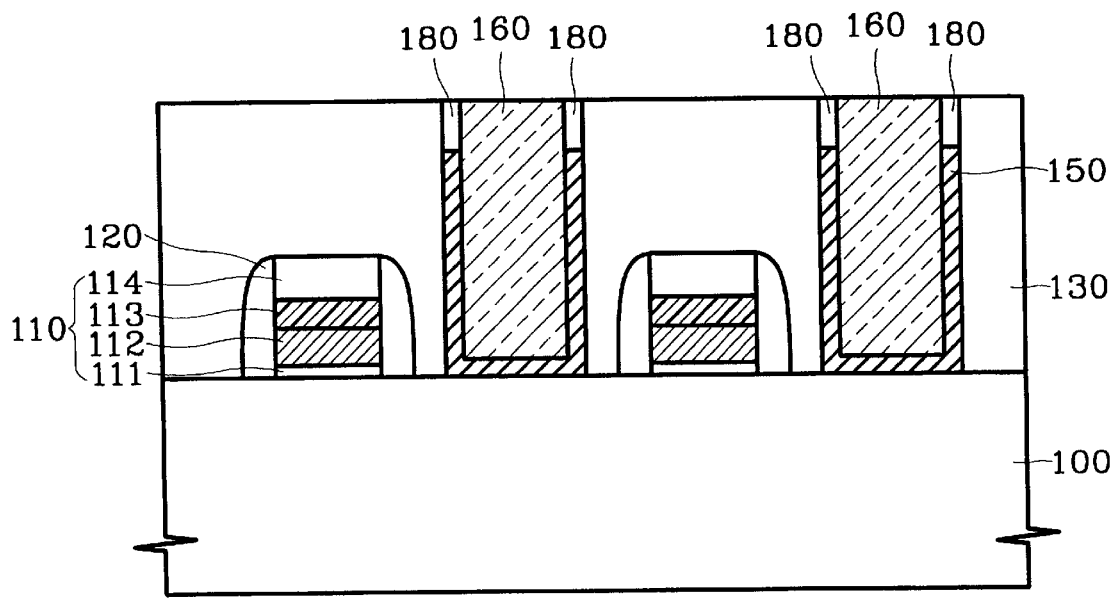

Referring to FIG. 4, a silicon nitride layer 180 is formed as an etch stopper to a thickness of about 300–400 Å on the entire resultant surface shown in FIG. 3. The silicon nitride layer 180 on the top surface of the lower interlayer dielectric layer 130 is removed by planarizing or etching back. Then, as shown, the silicon nitride layer 180 fills the grooves 170 shown in FIG. 3, leaving the surface of the lower interlayer dielectric layer 130 and each conductive plug 160 exposed. The silicon nitride layer 180 inhibits the metal barrier layer 150 from being overetched due to a possible misalignment in a subsequent etching process of forming metal contact holes.

Figure 5:
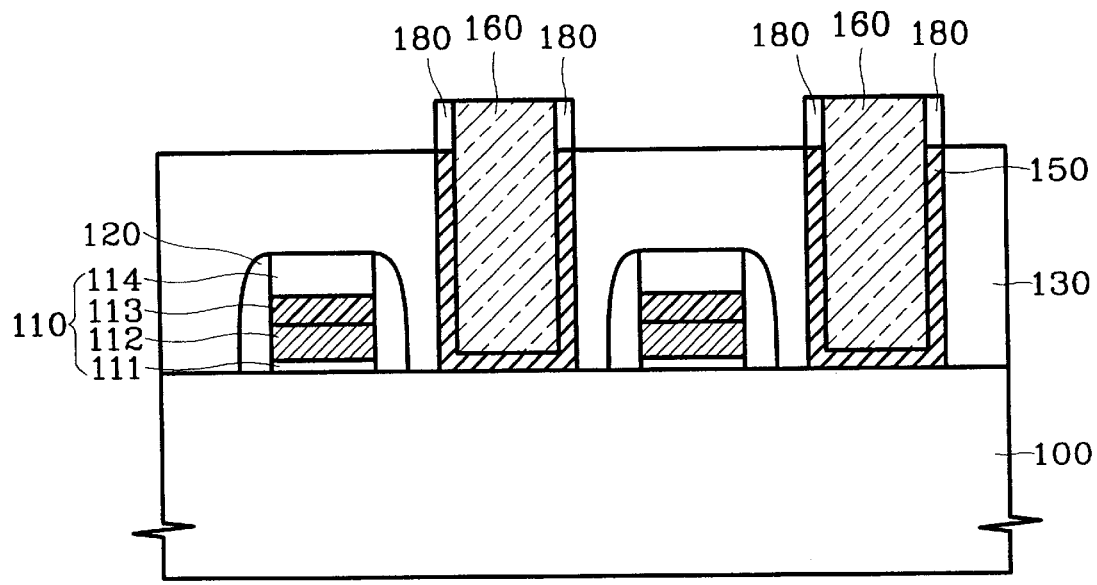

Referring to FIG. 5, the lower interlayer dielectric layer 130 is partially etched so that the conductive plug 160 surrounded by the silicon nitride layer 180 protrudes above the lower interlayer dielectric layer 130. Here, the lower interlayer dielectric layer 130 is etched under a condition that the silicon nitride layer 180 and the conductive plug have excellent, i.e., high, etching selectivity to the lower interlayer dielectric layer 130. The lower interlayer dielectric layer 130 is removed by about 500–700 Å.

Figure 6:
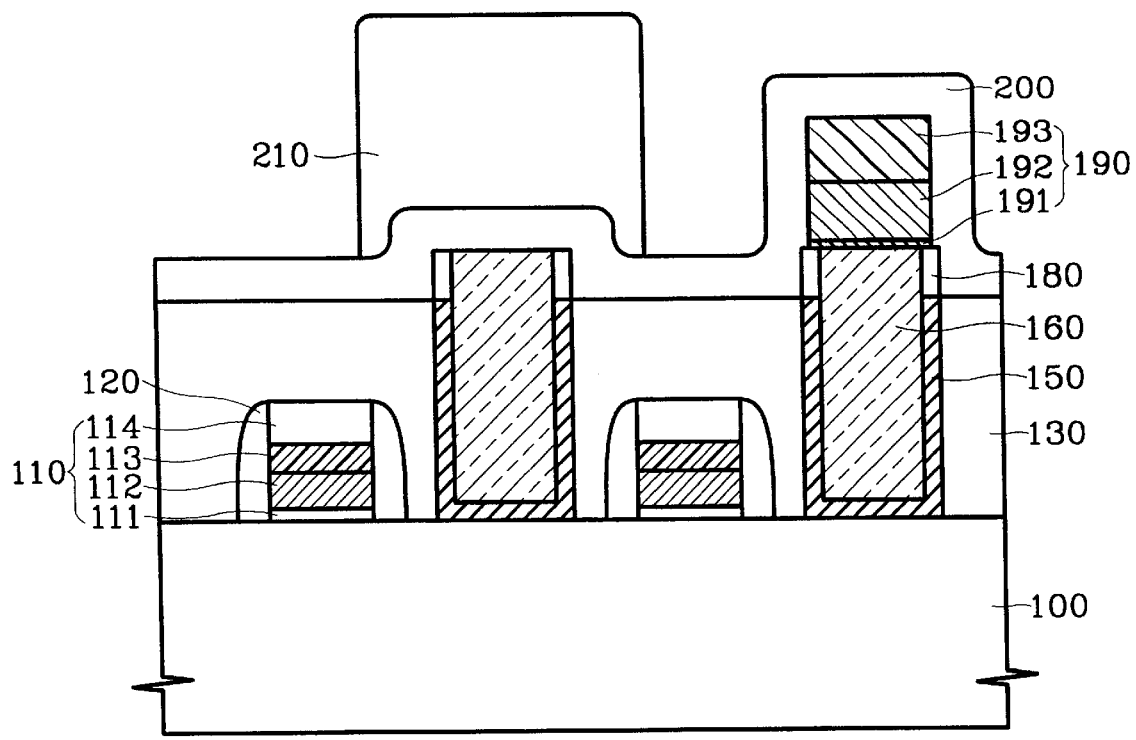

Referring to FIG. 6, a bit line stack 190 is formed on one conductive plug 160. The bit line stack 190 is formed by sequentially stacking a bit line metal barrier layer pattern 191, a bit line conductive layer pattern 192, and a bit line capping layer pattern 193. The bit line metal barrier layer pattern 191, the bit line conductive layer pattern 192, and the bit line capping layer pattern 193 are formed of TiN, tungsten, and silicon nitride, respectively. The bit line capping layer pattern 193 has a thickness of about 1000–2000 Å. In the process of forming the bit line stack 190, a bit line metal barrier layer, a bit line conductive layer, and a bit line capping layer are sequentially stacked on the lower interlayer dielectric layer 130, the silicon nitride layer 180, and the conductive plug 160. Then, the bit line capping layer, the bit line conductive layer, and the bit line metal barrier layer are sequentially patterned using a mask layer pattern, thereby completing the bit line stack 190. The mask layer pattern is then removed. A silicon nitride layer 200 is formed to a thickness of about 300–600 Å on the entire resultant surface where the bit line stack 190 is formed to form bit line spacers and an etch stopper. A photoresist layer pattern 210 is formed covering a portion of the silicon nitride layer 200 in an active metal contact region.

Figure 7:
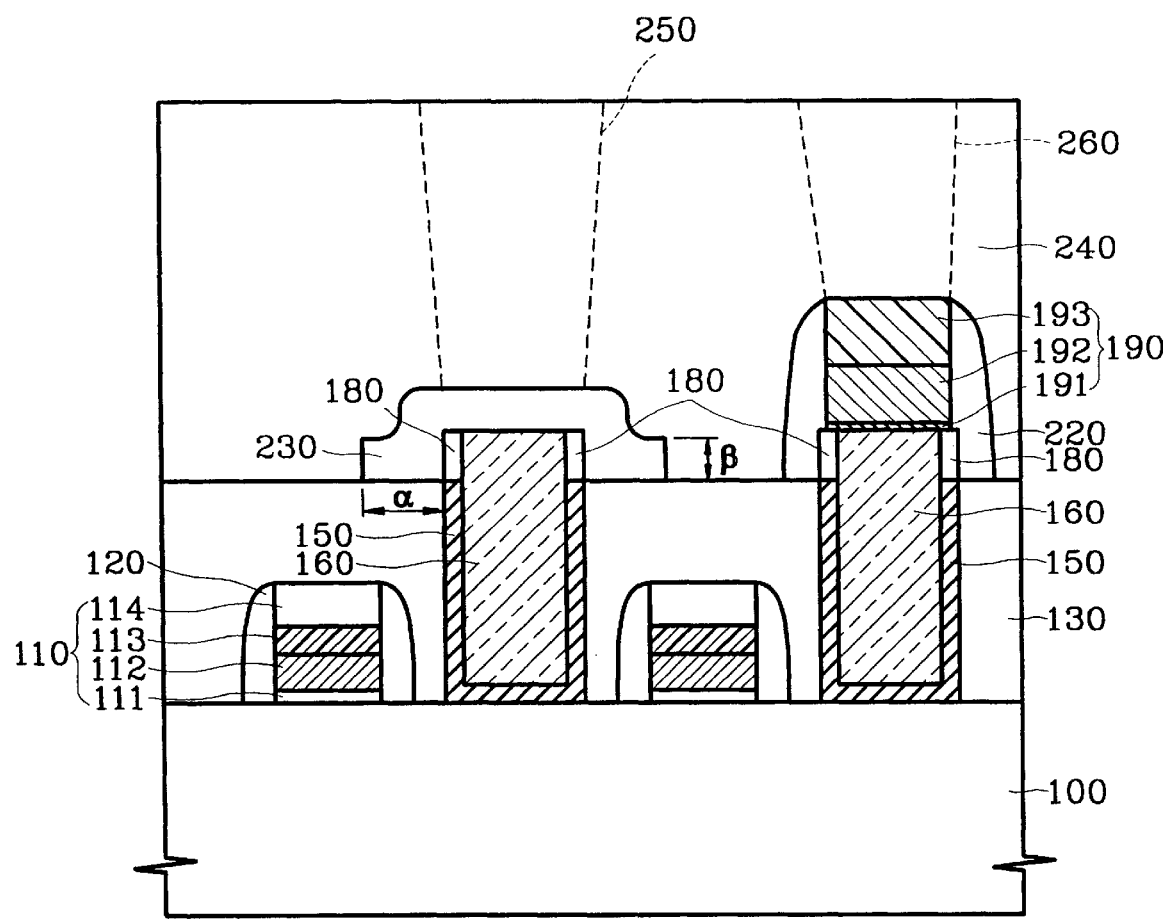

Referring to FIG. 7, etching back is performed using the photoresist layer pattern 210 as an etching mask, thereby forming bit line spacers 220 and, simultaneously, a silicon nitride layer pattern 230 as an etch stopper in the active metal contact region. The silicon nitride layer pattern 230 extends to a width "a" to cover portions of the lower interlayer dielectric layer 130 as well as the surface of the conductive plug 160. An upper interlayer dielectric layer 240 is formed on the entire resultant surface. A contact hole 250 (marked by a dotted line) for active metal contact and a contact hole 260 (marked by a dotted line) for bit line metal contact are formed so that they perforate the upper interlayer dielectric layer 240. For the formation of the contact holes 250 and 260, portions of the upper interlayer dielectric layer 140 are removed using a mask layer pattern as an etching mask. Then the surface of the silicon nitride layer pattern 230 as the etch stopper is exposed in the active metal contact region, and the surface of the bit line capping layer pattern 193 is exposed in the bit line contact region. The mask layer pattern is formed by a common photolithographic process in which a margin for misalignment can be ensured by the width "α" of the silicon nitride layer pattern 230.

The silicon nitride layer pattern 230 and the bit line capping layer pattern 193 are etched to form contact holes which expose the conductive plug 160 and the bit line conductive layer 192. Here, the silicon nitride layer pattern 230 in the active metal contact region is removed faster than the bit line capping layer pattern 193 in the bit line contact region due to the difference in the thicknesses of the silicon nitride layer pattern 230 and the bit line capping layer pattern 193. As a result, the metal barrier layer 150 and the lower interlayer dielectric layer 130 may be overetched in the active metal contact region while the bit line capping layer 193 is being removed in the bit line contact region. However, the silicon nitride layer 180 inhibits the metal barrier layer 150 and the lower interlayer dielectric layer 130 from being overetched in the active metal contact region. In other words, overetching can be prevented by the silicon nitride layer 180 having a thickness of "β". A metal layer fills the contact holes which expose the conductive plug 160 in the active metal contact region and the bit line conductive layer pattern 192 in the bit line contact region, thereby completing metal contacts.

Figure 8:
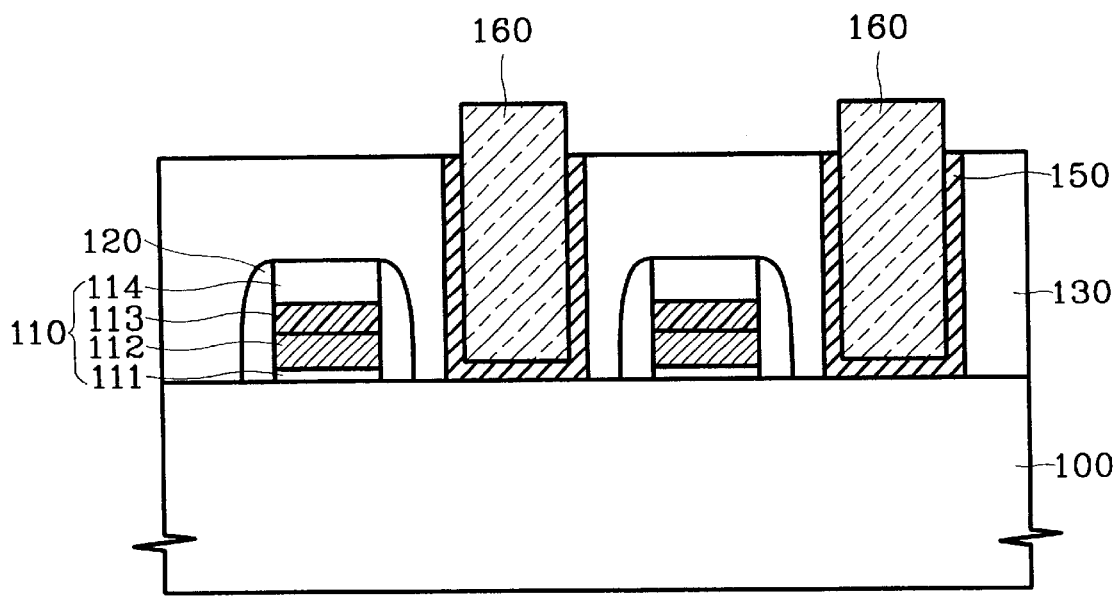
FIGS. 8 through 10 are cross-sectional views showing a method of forming a metal contact in a semiconductor device according to another embodiment of the present invention.
Figure 9:
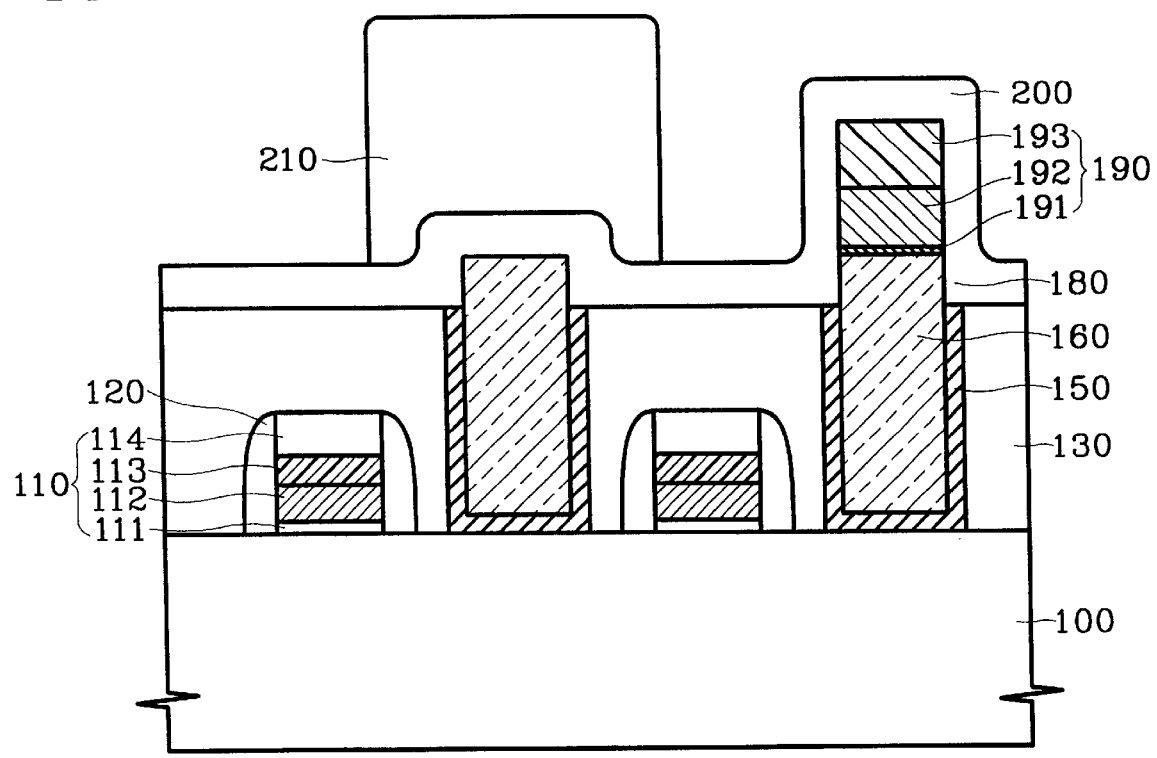
Figure 10:
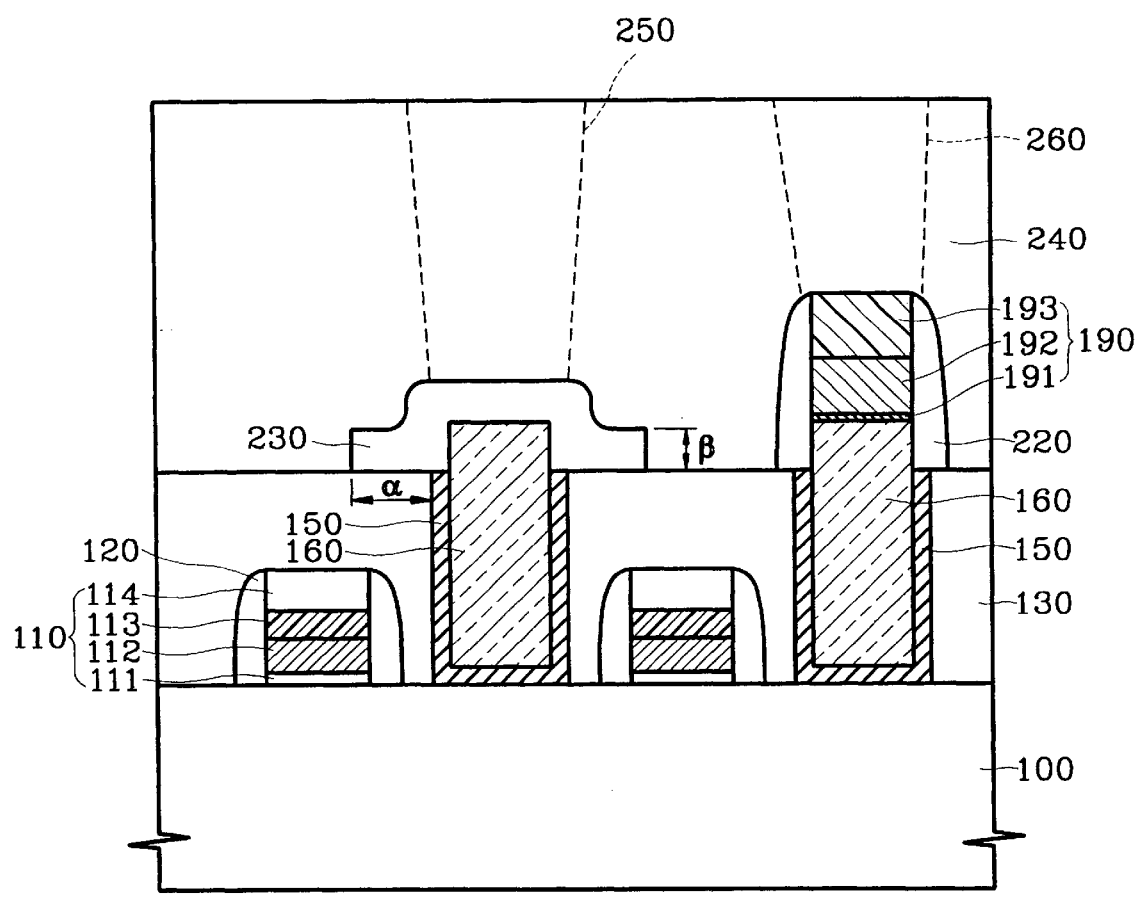

FIGS. 8 through 10 are cross-sectional views showing a method of forming metal contacts in a semiconductor substrate according to a second embodiment of the present invention. In the present embodiment, only processes different than those of the first embodiment will be described.

Referring to FIG. 8, as described with reference to FIGS. 1 through 3, grooves 170 (shown in FIG. 3) are formed around conductive plugs 160. The grooves 170 are not filled and are left empty. In the present embodiment, a process of filling the grooves 170 with another material is omitted. A portion of the lower interlayer dielectric layer 130 is etched so that each conductive plug 160 exposed by the grooves 170 completely protrude above the lower interlayer dielectric layer 130.

As shown in FIG. 9, a bit line stack 190 is formed. A silicon nitride layer 200 is formed on the entire resultant surface where the bit line stack 190 is formed to form bit line spacers and an etch stopper. A photoresist layer pattern 210 is formed to cover a portion of the silicon nitride layer 200. Here, as described previously, the photoresist layer pattern 210 covers a portion of the silicon nitride layer 200 in an active metal contact region.

As shown in FIG. 10, a silicon nitride layer pattern 230 is formed as an etch stopper in the active metal contact region while bit line spacers 220 are formed in a bit line contact region. In the present embodiment, the silicon nitride layer pattern 230 surrounds each conductive plug 160 since the grooves 170 around each conductive plug 160 are not filled. The silicon nitride layer pattern 230 on the conductive plug 160 may be completely removed during a subsequent process of etching a bit line capping layer 193 and the silicon nitride layer pattern 230. However, the silicon nitride layer pattern 230 at the sidewalls of the conductive plug 160 inhibits the metal barrier layer 150 and the lower interlayer dielectric layer 130 from being overetched.

As described above, in the method of forming metal contacts in a semiconductor device according to the present invention, the conductive plug protrudes above the lower interlayer dielectric layer by a predetermined amount. Metal contact pads are formed so that they extend above the lower interlayer dielectric layer by a predetermined length and cover the conductive plug, thereby increasing the margin for misalignment in a photolithographic process. Also, a portion of the metal barrier layer, which surrounds the conductive plug, is removed to form the silicon nitride layer as the etch stopper therein. Thus, the silicon nitride layer inhibits the metal barrier layer and the lower interlayer dielectric layer in the active metal contact region from being overetched.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of forming a metal contact in a semiconductor device having an active metal contact region and a bit line contact region, the method comprising:

forming gate stacks on a semiconductor substrate;

forming gate spacers on the sidewalls of the gate stacks;

forming a lower interlayer dielectric layer to cover the gate stacks and the gate spacers;

forming first contact holes which perforate the lower interlayer dielectric layer and expose an active region of the semiconductor substrate;

filling the first contact holes with a metal barrier layer and a conductive plug;

removing an upper portion of the metal barrier layer to form at least one groove in the lower interlayer dielectric layer surrounding the upper sides of the conductive plug;

filling the grooves with an etch stopper;

etching the lower interlayer dielectric layer so that the etch stopper protrudes above the lower interlayer dielectric layer;

forming a bit line stack by sequentially stacking a bit line conductive layer and a bit line capping layer on the conductive plug in the bit line contact region;

forming an etch stopper on the conductive plug in the active metal contact region and bit line spacers at the sidewalls of the bit line stack in the bit line contact region; forming an upper interlayer dielectric layer to cover the etch stopper, the bit line stack, and the bit line spacers;

etching a portion of the upper interlayer dielectric layer to form second contact holes which expose the etch stopper and the surface of the bit line capping layer; removing the etch stopper and the exposed portion of the bit line capping layer pattern to form third contact holes which expose the conductive plug in the active metal contact region and the bit line conductive layer in the bit line contact region; and filling the third contact holes with a conductive layer.

2. The method of claim 1, wherein the gate stacks are formed by sequentially stacking gate dielectric layer patterns, gate conductive layer patterns, metal silicide layer patterns, and gate capping layer patterns.

3. The method of claim 1, wherein the lower interlayer dielectric layer has a thickness of 1500–1700 Å above the upper surface of the gate stacks.

4. The method of claim 1, wherein the grooves around the upper sides of the conductive plug have a depth of 500–700 Å and a width of 30–40 nm.

5. The method of claim 1, wherein the etch stopper filling the grooves is formed of a material having a high etching selectivity to the lower interlayer dielectric layer.

6. The method of claim 5, wherein the lower interlayer dielectric layer is a silicon oxide layer, and the etch stopper is a silicon nitride layer.

7. The method of claim 1, wherein forming the etch stopper and the bit line spacers comprises:

forming an etch stopper on the lower interlayer dielectric layer to cover the etch stopper and the conductive plug in the active metal contact region and cover the etch stopper and the bit line stack in the bit line contact region;

forming a mask layer pattern to cover the etch stopper in the active metal contact region;

etching the etch stopper by an anisotropic method using the mask layer pattern as an etching mask; and removing the mask layer pattern.

8. The method of claim 1, wherein the etch stopper in the active metal contact region protrudes above the lower interlayer dielectric layer.

9. The method of claim 1, wherein the etch stopper is formed of a material having a high etching selectivity to the upper interlayer dielectric layer.

10. The method of claim 9, wherein the upper interlayer dielectric layer is a silicon oxide layer, and the etch stopper is a silicon nitride layer pattern.

11. The method of claim 1, wherein the etch stopper has a thickness of 300–600 Å, and the bit line capping layer pattern has a thickness of 1000–2000 Å.

12. A method of forming metal contacts in a semiconductor device having an active metal contact region and a bit line contact region, comprising:

forming gate stacks on a semiconductor substrate;

forming gate spacers on the sidewalls of the gate stacks;

forming a lower interlayer dielectric layer to cover the gate stacks and the gate spacers;

forming first contact holes which perforate the lower interlayer dielectric layer and expose an active region of the semiconductor substrate;

filling the first contact holes with a metal barrier layer and a conductive plug;

removing an upper portion of the metal barrier layer to form at least one groove in the lower interlayer dielectric layer surrounding the upper sides of the conductive plug;

etching the lower interlayer dielectric layer so that the exposed upper portion of the conductive plug protrudes above the lower interlayer dielectric layer;

forming a bit line stack by sequentially stacking a bit line conductive layer pattern and a bit line capping layer pattern on the conductive plug in the bit line contact region;

forming an etch stopper on the conductive plug in the active metal contact region and bit line spacers on the sidewalls of the bit line stack in the bit line contact region;

forming an upper interlayer dielectric layer to cover the etch stopper, the bit line stack, and the bit line spacers;

etching a portion of the upper interlayer dielectric layer to form second contact holes which expose the etch stopper and the bit line capping layer;

removing the etch stopper and the exposed portion of the bit line capping layer pattern to form third contact holes which expose the conductive plug in the active metal contact region and the bit line conductive layer in the bit line contact region; and filling the third contact holes with a conductive layer.

13. The method of claim 12, wherein forming the etch stopper and the bit line spacers comprises:

forming an etch stopper on the lower interlayer dielectric layer to cover the conductive plug in the active metal contact region and the bit line stack in the bit line contact region;

forming a mask layer pattern to cover the etch stopper in the active metal contact region;

etching the etch stopper by an anisotropic method using the mask layer pattern as an etching mask; and removing the mask layer pattern.

14. The method of claim 12, wherein the etch stopper in the active metal contact region protrudes above the lower interlayer dielectric layer.

15. The method of claim 12, wherein the etch stopper is formed of a material having a high etching selectivity to the upper interlayer dielectric layer.

16. The method of claim 15, wherein the upper interlayer dielectric layer is a silicon oxide layer, and the etch stopper is a silicon nitride layer.

17. The method of claim 12, wherein the etch stopper has a thickness of 300–600 Å, and the bit line capping layer pattern has a thickness of 1000–2000 Å.

* * * * *